United States Patent [19]

Takabayashi

[11] Patent Number: 4,964,700
[45] Date of Patent: Oct. 23, 1990

[54] CONNECTION STRUCTURE BETWEEN A LIQUID CRYSTAL PANEL AND AN EXTERNAL CIRCUIT

[75] Inventor: Hiroshi Takabayashi, Kanagawa, Japan

[73] Assignee: Canon Kabushiki Kaisha, Japan

[21] Appl. No.: 445,944

[22] Filed: Dec. 8, 1989

Related U.S. Application Data

[63] Continuation of Ser. No. 207,231, Jun. 16, 1988, abandoned.

[30] Foreign Application Priority Data

Jun. 19, 1987 [JP] Japan ................... 62-153016

[51] Int. Cl.$^5$ ................................ G02F 1/13
[52] U.S. Cl. ..................... 350/336; 350/334; 350/350 S
[58] Field of Search ............... 350/350 S, 336, 334, 350/333

[56] References Cited

U.S. PATENT DOCUMENTS

| 4,592,858 | 6/1986 | Higuchi et al. | 350/350 S |
| 4,639,089 | 1/1987 | Okada et al. | 350/350 S |
| 4,640,581 | 2/1937 | Nakanowatari et al. | 350/336 |
| 4,723,839 | 2/1988 | Nakanowatari et al. | 350/350 S |

FOREIGN PATENT DOCUMENTS

| 0110382 | 6/1984 | European Pat. Off. | 350/336 |
| 0025464 | 2/1979 | Japan | 350/336 |
| 0035326 | 3/1980 | Japan | 350/336 |
| 0070529 | 6/1981 | Japan | 350/336 |

*Primary Examiner*—Stanley D. Miller
*Assistant Examiner*—Huy K. Mai
*Attorney, Agent, or Firm*—Fitzpatrick, Cella, Harper & Scinto

[57] ABSTRACT

A connection structure between a liquid crystal panel and an external circuit. The connection structure comprise an external circuit connection electrode connected to a drive electrode for a liquid crystal panel with a ferroelectric liquid crystal and arranged on a substrate of the liquid crystal panel, an external circuit electrode connected to an external circuit and arranged on a substrate of the external circuit, and a thermosetting component arranged between the external circuit connection electrode and the external circuit electrode and composed of a thermosetting resin containing dispersed conductor particles.

43 Claims, 3 Drawing Sheets

CONNECTION STRUCTURE BETWEEN A LIQUID CRYSTAL PANEL AND AN EXTERNAL CIRCUIT

This application is a continuation of application Ser. No. 07/207,231, filed June 16, 1988 now, abandoned.

BACKGROUND OF THE INVENTION

1. Field of the Invention:

This invention relates to an electrical connection structure between a liquid crystal panel equipped with a ferroelectric liquid crystal and an external control circuit.

2. Description of the Related Art:

In the art, the method is well known of connecting an FPC (flexible printed circuit) with a liquid crystal panel by thermocompression bonding of an anisotropic conductive film which is composed of an insulating resin containing dispersed conductor particles.

Recently, a ferroelectirc liquid crystal element with memory characteristics has been disclosed in U.S. Pat. No. 4,367,924 to Clark et al., etc. This ferroelectric liquid crystal element is applicable to a display panel utilizing the multiplexing drive proposed by Kanbe et al. in U.S. Pat. No. 4,655,561, etc., from which a high definition display on a wide liquid crystal screen is to be expected.

As clearly shown by Okada et al. in U.S. Pat. No. 4,639,089, etc., the above-mentioned liquid crystal element can only present a monodomain orientation when it is gradually cooled down (ca. 5 C/hr.) from an isotropic phase on the high temperature side until a chiral smectic phase is attained after going through a cholesteric phase and a smectic A phase. Under existing circumstances, a monodomain orientation is not to be obtained when the temperature is raised or lowered rapidly to attain a chiral smectic phase or an isotropic phase.

As will be understood, the above-mentioned conventional method of electrically connecting a liquid crystal panel with an external control circuit by thermocompression bonding involves a partially or entirely rapid heating of the liquid crystal element. Accordingly, when this method is applied to the above-mentioned ferroelectric liquid crystal element, the rapid heating and subsequent cooling of the element may prevent it from attaining a monodomain orientation when the chiral smectic phase is regained. Such a disturbance in the orientation may be changed to the monodomain state by a re-orientation process. This, however, involves some problems: for example, employment of an anisotropic conductive adhesive mainly composed of a conventional thermoplastic resin during re-orientation will increase the connection resistance, as will be described later.

SUMMARY OF THE INVENTION

Accordingly, it is an object of this invention to provide a connection structure between a liquid crystal panel and an external circuit which is free from the above problems and particularly one which offers a satisfactory electrical connection without disturbing the orientation of the ferroelectric liquid crystal.

The connection structure between a liquid crystal panel and an external circuit in accordance with this invention comprises an external circuit connection electrode connected to a drive electrode for a liquid crystal panel with a ferroelectric liquid crystal and arranged on a substrate of the liquid crystal panel, an external circuit electrode connected to an external circuit and arranged on a substrate of the external circuit, and a thermosetting component arranged between the external circuit connection electrode and the external circuit electrode and composed of a thermosetting resin containing dispersed conductor particles.

BRIEF DESCRIPTION OF THE DRAWINGS

FIG. 3($b$) is a diagram showing the change in the connection resistance with time in a conventional connection structure. FIG. 3($c$) is a diagram showing the change in the connection resistance with time in the connection structure of this invention.

DETAILED DESCRIPTION OF THE PREFERRED EMBODIMENT

An embodiment of this invention will now be described with reference to the attached drawings.

Figure 1:
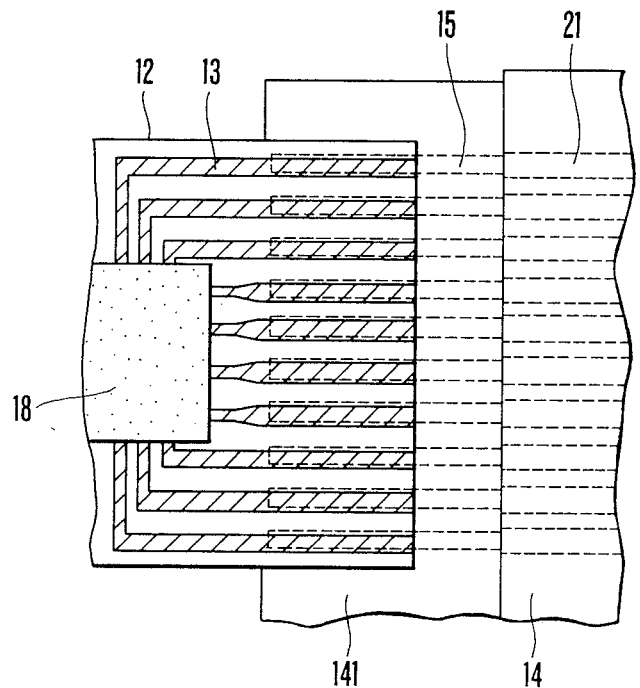
FIG. 1 is a plan view of the connection structure in accordance with this invention.
Figure 2:
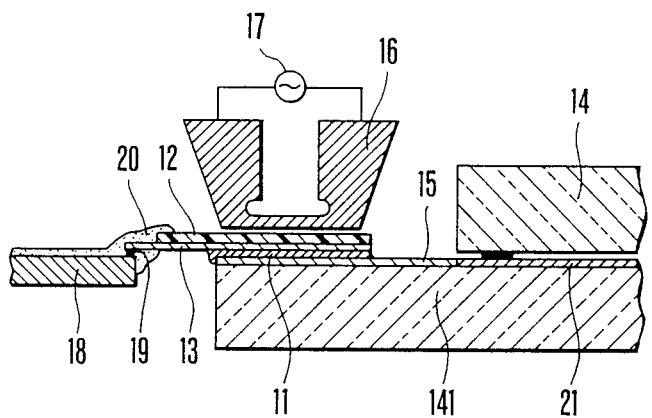
FIG. 2 is a sectional view of the same.

The connection structure shown in FIGS. 1 and 2 includes an anisotropic conductive adhesive 11 which consists of a film made of a thermosetting resin containing dispersed conductor particles and which is capable of forming a thermosetting component under a predetermined thermosetting condition. Metal or alloY particles such as Ni, Au, Ag, solder, etc. or spherical resin particles coated with Au, Ni, etc. may be employed as the conductor particles with satisfactory conductivity. In the case of spherical resin particles, they should have a coefficient of linear expansion that is about the same as that of the thermosetting resin. In view of the necessity of avoiding an increase in the connection resistance due to heating in the re-orientation process, these conductor particles comprise 0.5 to 50, and preferably 5 to 20, parts by weight per 100 parts by weight of the solid portion of the thermosetting resin, and their average particle diameter is 1 to 50 $\mu$m, preferably 5 to 20 $\mu$m.

As the thermosetting resin, a thermosetting epoxy adhesive, a thermosetting silicon resin, a thermosetting polyimide resin, etc. may be employed.

The above mentioned anisotropic conductive adhesive 11, which is set under a predetermined setting condition, is arranged between an external circuit connection electrode 15 led out from a liquid crystal drive electrode 21 wired on a substrate 141 of a liquid crystal panel 14 (a scanning electrode, signal electrode, etc.) and an external circuit electrode 13 wired on a film carrier tape 12. When this anisotropic conductive adhesive 11 contains a thermosetting resin as the main element, the setting process can be conducted by means of a heat tool 16.

The heat tool 16 may be formed from a metal or an alloy with high resistance such as molybdenum and stainless steel. To this heat tool 16 is connected a heating power source 17, which feeds the heat tool 16 with a voltage of 0.1 to 10V, preferably 1 to 5V, and a current, of 0.1 to 20A, preferably 0.5 to 5A. The thermocompression bonding time may be on the order of 10 to 30 seconds.

When the above anisotropic conductive adhesive 11 is in a paste-like state, it may be coated by printing, etc., or used in the form of a half-set film.

Figure 3A:
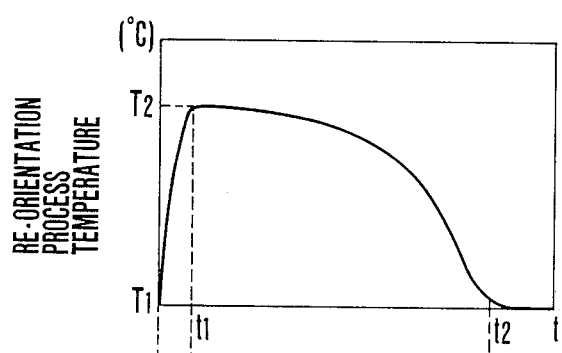
FIG. 3($a$) is a diagram showing the change in the re-orientation process temperature with time.
Figure 3B:
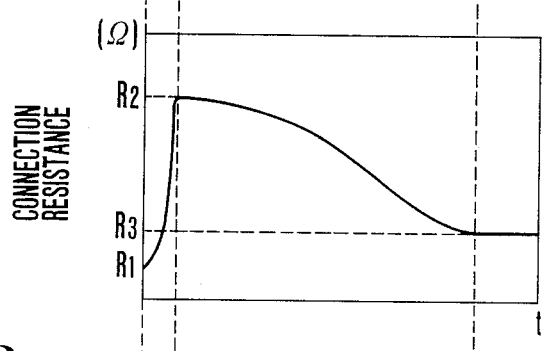
Figure 3C:
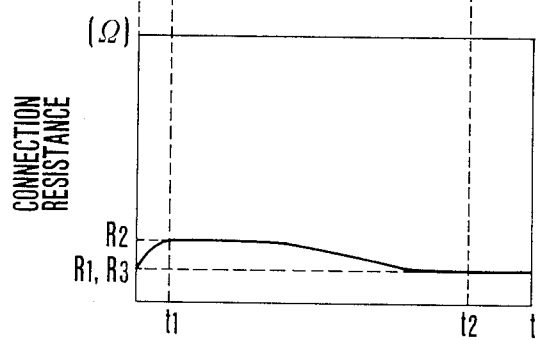

FIGS. 3(a) to 3(c) are graphs illustrating the effects of this embodiment, of which FIG. 3(a) shows the temperature plotted against time for the re-orientation process. FIG. 3(b) shows the connection resistance values during the re-orientation process of a mounting structure other than that of the present invention which is composed of a thermoplastic resin component comprising an anisotropic conductive adhesive (50 parts by weight of a copolymer of styrene and butadiene) and a terpene phenol resin (50 parts by weight), said resin component containing 10 parts by weight of dispersed conductor particles composed of high accuracy setting spherical resin particles, EPOSTAR-GP-90 (by NIPPON SHOKUBAI KAGAKU KOGYO CO., LTD.), which are coated with Au. FIG. 3(C) shows the connection resistance values during the re-orientation process of a mounting structure of the present invention (100 parts by weight of a thermosetting epoxy resin with 10 parts by weight of the above-mentioned conductors dispersed therein).

As shown in FIGS. 3(a) to 3(c), the temperature was raised from room temperature $T_1$ (ca. 23° C.) to the re-orientation temperature $T_2$ (80° C.) in order to effect re-orientation, and then a gradual cooling down for about two hours was effected from time $t_1$ to time $t_2$. In the case of a mounting structure other than that of the present invention, the initial connection resistance value $R_1$ (ca. 2Ω) rose up to $R_2$ (ca. 10Ω) in the 80° C. atmosphere. After the gradual cooling down, the connection resistance value $R_3$ at room temperature $T_1$ (23° C.) was ca. 3Ω, a value augmented as compared with the initial one. This may be attributable to the difference in the coefficient of linear expansion between the thermoplastic resin, the glass substrate of the liquid crystal element and the film carrier tape as well as to the softening of the thermoplastic resin due to the re-orientation process temperature, which reduces the adhesive strength thereof, so that the distance between the connection electrode of the liquid crystal element and that of the film carrier tape is enlarged, resulting in a reduced contact area and reduced contact conductor particles. contributing to the electrical connection.

In the case of this embodiment of this invention, the initial connection resistance value $R_1$ (ca. 2Ω) was raised to $R_2$ (ca. 3Ω) in the 80° C. atmosphere. However, a gradual cooling down for about two hours from time $t_1$ to time $t_2$ rendered it $R_3$ (ca. 2Ω), a value approximately equal to the initial resistance value $R_1$. The slight increase in the connection resistance value in the 80° C. atmosphere and its return to the initial value after the gradual cooling down to room temperature may be attributable to the expansion of the thermosetting resin Thus, it has been proved that the present invention involves no increase in the connection resistance of the anisotropic conductive adhesive even after a re-orientation process (a process for restoring an earlier monodomain isotropic phase, this process being necessary to overcome any disturbed orientation in a ferroelectric liquid crystal caused by rapid cooling and heating, which process consists in re-heating the liquid crystal concerned until it regains an isotropic phase and cooling it down as described above).

The above-mentioned external circuit electrode 13 wired on the film carrier tape 12 is electrically connected to an IC 18 provided as an external control circuit. The IC 18 is connected to the external circuit electrode 13 on the film carrier tape 12 by means of a bonding member 19, the surrounding portion being protected by an adhesive 20.

The bistable liquid crystal used in this invention should most preferably be a ferroelectric chiral smectic liquid crystal. The most suited may be a chiral smectic C phase (SmC*) or H phase (SmH*) liquid crystal. Such ferroelectric liquid crystals are described in "Le Journal de Physic Letter", vol. 36 (L-69), the 1975 issue of "Ferroelectric Liquid Crystals", "Applied Physics Letters", vol 36 (No. 11), the 1980 issue of "Submicron Second Bistable Electroopitc Switching in Liquid Crystal", the 1981 issue of "Solid State Physics", 16 (141), (Liquid Crystal), U.S. Pats. Nos. 4,561,726, 4,589,996, 4,592,858, etc. The ferroelectric liquid crystals disclosed in these publications may be employed in the present invention.

More specifically, decyloxybenzylidene - P'- amino - 2 -methylbutylcinnamate (DOBAMBC), hexyloxybenzylidene - P' - amino - 2 - chloropropylcinnamate (HOBACPC) and 4 - o - (2 - methyl) - butylresorcylidene - 4' - octylaniline (MBRA8) may be mentioned as ferroelectric liquid crystal compounds applicable to the present invention.

In preparing a ferroelectric liquid crystal element using materials selected from among those mentioned above, the element maY, if necessary, be supported by a copper block with an embedded heater or the like so as to maintain a temperature which will provide the SmC* or SmH*phase of the liquid crYstal compound.

Apart from the above-described SmC and SmH phase liquid crystals, such ferroelectric liquid crystals as can be represented with the chiral smectic F, I, J, G or K phase may also be emploYed in this invention.

Figure 4:
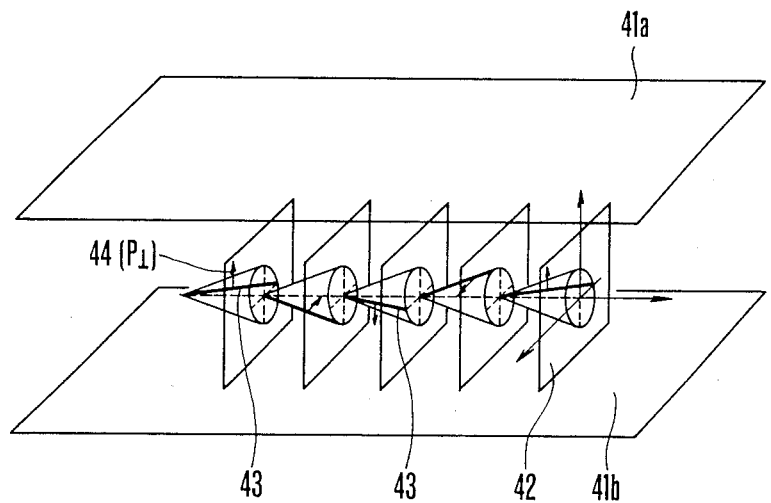
FIGS. 4 and 5 are perspective views showing the ferroelectric liquid crystal element employed in this invention.
Figure 5:
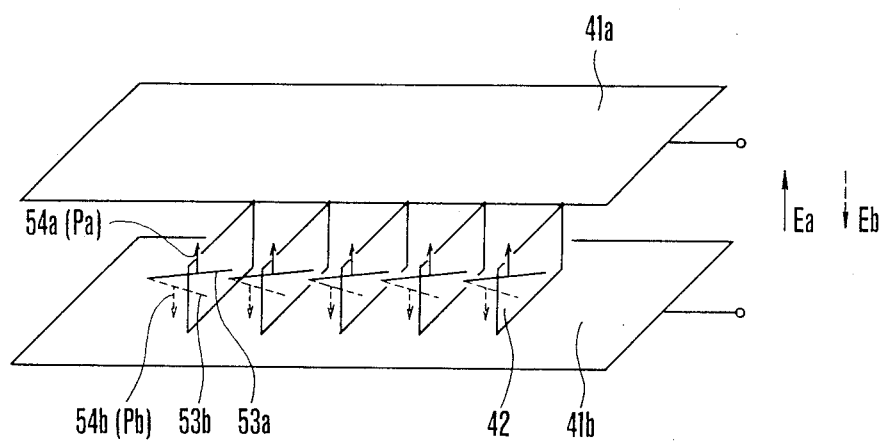

FIG. 4 shows an example of the ferroelectric liquid crystal cell schematically 41a and 41b denote substrates (glass plates) coated with a transparent electrode such as $In_2O_3$, $SnO_2$ and ITO (indium-tin-oxide) between which an SmC* phase liquid crYstal is enclosed in such a manner that the liquid crystal molecule layers 42 are arranged at right angles to the glass surfaces The thick lines 43 denote liquid crystal molecules each having a dipole moment (P ⊥) perpendicular to it. By applying voltage over a certain threshold between the electrodes on the substrates 41a and 41b, the spiral construction of the liquid crystal molecules 43 come undone and the orientation of the liquid crystal molecules 43 can be changed in such a manner that dipole moments (P⊥) are all directed in the direction of the electric field. The liquid crystal molecules 43 are of a long and narrow configuration and show index anisotropy in the major and minor axis directions. Therefore, it will be easily understood that by placing polarizers on both sides of the glass surfaces in a cross-nicol position, a liquid crystal optical modulation element having optical properties varying with voltage application polarities can be obtained. When the liquid crystal cell is sufficiently thin (eg. 1μ), the spiral construction of the liquid crystal molecule comes undone even when no electric field is applied thereto, its dipole moment Pa or Pb being directed either upwards (54a) or downwards (54b). When, as shown in FIG. 5, an electric field Ea or Eb over a certain threshold and having different polarities is imparted to such a cell for a predetermined period of time, the dipole moment is directed upwards (54a) or downwards (54b) with respect to the electric field vector, and in accordance with this change in direction, the liquid crystal molecules are oriented either in the first or second stable condition 53a or 53b.

Using such a ferroelectric liquid crystal as an optical modulation element has a two-fold merit: first, its response velocitY is very high. Second, the orientation of its liquid crystal molecules presents a bistability. The second point may be explained referring to FIG. 5. Application of the electric field Ea causes the liquid crystal molecules to be oriented in the first stable condition 53a. In this condition, the stability is maintained even if the electric field is turned off. Application of the reverse electric field Eb causes the liquid crystal molecules to be oriented in the second stable condition 53b. The condition is also maintained in this case even if the electric field is turned off. The molecules are maintained in their respective orientations as long as the electric field remains below a certain threshold. For such a high response velocitY and bistability to be realized effectivelY, the cells should preferably be as thin as possible; generally, the suitable thickness thereof may be 0.5 to 20μ, and especially 1 to 5μ.

As described above, by placing a conductive anisotropic adhesive composed of a thermosetting resin containing dispersed conductive particles between the connection electrodes of a ferroelectric liquid crYstal element and a film carrier tape and by connecting these components together by thermocompression bonding, a mounting structure can be obtained in which the connection resistance remains stable, irrespective of the re-orientation process temperature of the ferroelectric liquid crystal display element, thereby enhancing the reliability of such an element.

What is claimed is:

1. A liquid crystal apparatus comprising:
   (a) a liquid crystal panel having a chiral smectic liquid crystal developed by temperature decrease from a first temperature higher than a second temperature which develops a chiral smectic phase;
   (b) a driving circuit for driving said liquid crystal panel; and
   (c) connecting means for electrically connecting said liquid crystal panel and said driving circuit, comprising a first terminal provided on said liquid crystal panel, a second terminal provided on said driving circuit, and a thermoset film containing plural dispersed conductor particles, disposed between said first and second terminals.

2. A liquid crystal apparatus according to claim 1, wherein said smectic liquid crystal is developed by the temperature decrease from the first temperature, with an electrical connection between said liquid crystal panel and said driving circuit.

3. A liquid crystal apparatus according to claim 1, wherein said thermoset film is formed by heating a film comprising a thermosetting resin containing said plural dispersed conductor particles.

4. A liquid crystal apparatus according to claim 3, wherein said thermoset film is a material selected from the group consisting of thermosetting epoxy resin, thermosetting silicon resin, and thermosetting polyamide resin.

5. A liquid crystal apparatus according to claim 3, wherein said thermoset film comprises 0.5 to 50 parts by weight of conductor and 100 parts by weight of a solid thermosetting resin.

6. A liquid crystal apparatus according to claim 3, wherein said thermosetting film comprises 5 to 20 parts by weight of conductor and 100 parts by weight by solid thermosetting resin.

7. A liquid crystal apparatus according to claim 1, wherein said chiral smectic liquid crystal is developed by temperature decrease from an isotropic phase temperature as the first temperature.

8. A liquid crystal apparatus according to claim 1, wherein said chiral smectic liquid crystal shows a bistable molecular orientation state.

9. A liquid crystal apparatus according to claim 1, wherein the chiral smectic phase is either a chiral smectic C phase or a chiral smectic H phase.

10. A liquid crystal apparatus according to claim 1, wherein the chiral smectic phase is developed by a gradual cooling down from an isotropic phase after passing through a cholesteric phase and a smectic A phase.

11. A liquid crystal apparatus according to claim 1, wherein said thermostat film comprises 5 to 20 parts by weight of conductors and 100 parts by weight by a solid thermosetting resin.

12. A liquid crystal apparatus comprising:
    (a) a liquid crystal panel comprising a liquid crystal having a temperature range in which a chiral smectic phase is developed;
    (b) a driving circuit for driving said liquid crystal panel;
    (c) connecting means for electrically connecting said liquid crystal panel and said driving circuit, comprising a first terminal provided on said driving circuit, and a thermoset film containing plural dispersed conductor particles, disposed between said first and second terminals; and
    (d) means for heating said liquid crystal panel to a first temperature higher than that of the chiral smectic phase, and then cooling said liquid crystal panel to the chiral smectic phase temperature.

13. A liquid crystal apparatus according to claim 12, wherein said liquid crystal assumes an isotropic phase at the first temperature.

14. A liquid crystal apparatus according to claim 12, wherein said liquid crystal assumes a cholesteric phase at the first temperature.

15. A liquid crystal apparatus according to claim 12, wherein said thermoset film is formed by heating a film comprising a thermosetting resin containing said plural dispersed conductor particles.

16. A liquid crystal apparatus according to claim 12, wherein said thermosetting resin is a material selected from the group consisting of thermosetting epoxy resin, thermosetting silicon resin, and thermosetting polyamide resin.

17. A liquid crystal apparatus according to claim 12, wherein said thermoset film comprises 0.5 to 50 parts by weight of conductors and 100 parts by weight of a solid thermosetting resin.

18. A liquid crystal apparatus according to claim 12, wherein the chiral smectic liquid crystal shows a bistable molecular orientation state.

19. A liquid crystal apparatus according to claim 12, wherein the chiral smectic phase is a phase selected from the group consisting of a chiral smectic C phase and a chiral smectic H phase.

20. A liquid crystal apparatus according to claim 12, wherein said liquid crystal assumes the chiral smectic phase by a gradual cooling down from an isotropic phase after passing through a cholesteric phase and a smectic A phase.

21. A liquid crystal apparatus according to claim 12 wherein said liquid crystal assumes a smectic A phase at the first temperature.

22. A liquid crystal apparatus produced by a method comprising the steps of:
    (a) electrically connecting a liquid crystal panel comprising a liquid crystal having a temperature range showing a chiral smectic phase and a driving circuit for driving the liquid crystal panel, by disposing a thermoset film containing plural dispersed conductor particles between a first terminal provided on the liquid crystal panel and a second terminal provided on the driving circuit; and
    (b) heating the liquid crystal panel to a first temperature higher than that of the chiral smectic phase, and then cooling the liquid crystal panel to a temperature of the chiral smectic phase.

23. A liquid crystal apparatus according to claim 22, wherein said liquid crystal is one which assumes an isotropic phase at the first temperature.

24. A liquid crystal apparatus according to claim 22, wherein said liquid crystal is one which assumes a cholesteric phase at the first temperature.

25. A liquid crystal apparatus according to claim 22, wherein said liquid crystal is one which assumes a smectic a phase at the first temperature.

26. A liquid crystal apparatus according to claim 22, wherein said thermoset film is formed by heating a film comprising a thermosetting resin containing said plural dispersed conductor particles.

27. A liquid crystal apparatus according to claim 26, wherein said thermosetting resin is a material selected from the group consisting of thermosetting epoxy resin, thermosetting silicon resin, and thermosetting polyamide resin.

28. A liquid crystal apparatus according to claim 22, wherein said thermoset film comprises 0.5 to 50 parts by weight of conductors and 100 parts by weight of a solid thermosetting resin.

29. A liquid crystal apparatus according to claim 22, wherein said thermoset film comprises 5 to 20 parts by weight of conductors and 100 parts by weight of a solid thermosetting resin.

30. A liquid crystal apparatus according to claim 22, wherein said chiral smectic liquid crystal is one which shows a bistable molecular orientation state.

31. A liquid crystal apparatus according to claim 22, wherein the chiral smectic phase is developed by a gradual cooling down from an isotropic phase after passing through a cholesteric phase and a smectic A phase.

32. A liquid crystal apparatus according to claim 22, wherein the chiral smectic phase is a phase selected from the group consisting of a chiral smectic C phase and a chiral smectic H phase.

33. A method for connecting a liquid crystal apparatus comprising a liquid crystal panel and a driving circuit, said method comprising the steps of:
    (a) electrically connecting the liquid crystal panel comprising a liquid crystal having a temperature range showing a chiral smectic phase and the driving circuit for driving the liquid crystal panel, by disposing a thermoset film containing plural dispersed conductor particles between a first terminal provided on the liquid crystal panel and a second terminal provided on the driving circuit; and
    (b) heating the liquid crystal panel to a first temperature higher than that of the chiral smectic phase, and then cooling the liquid crystal panel to a temperature of the chiral smectic phase.

34. A method according to claim 33, wherein the liquid crystal is one which assumes an isotropic phase at the first temperature.

35. A method according to claim 33, wherein the liquid crystal is one which assumes a cholesteric phase at the first temperature.

36. A method according to claim 33, wherein the liquid crystal is one which assumes a smectic A phase at the first temperature.

37. A method according to claim 33, wherein the thermoset film is formed by heating a film comprising a thermosetting resin containing the plural dispersed conductor particles.

38. A method according to claim 37, wherein the thermosetting resin is a material selected from the group consisting of thermosetting epoxy resin, thermosetting silicon resin, and thermosetting polyamide resin.

39. A method according to claim 33, wherein the thermoset film comprises 0.5 to 50 parts by weight of conductors and 100 parts by weight of a solid thermosetting resin.

40. A method according to claim 33, wherein the thermoset film comprises 5 to 20 parts by weight of conductors and 100 parts by weight of a solid thermosetting resin.

41. A method according to claim 33, wherein the chiral smectic liquid crystal is one which shows a bistable molecular orientation state.

42. A method according to claim 23, wherein the chiral smectic phase is developed by a gradual cooling down from an isotropic phase after passing through a cholesteric phase and a smectic A phase.

43. A method according to claim 33, wherein the chiral smectic phase is a phase selected from the group consisting of a chiral smectic C phase and a chiral smectic H phase.

* * * * *

UNITED STATES PATENT AND TRADEMARK OFFICE
CERTIFICATE OF CORRECTION

PATENT NO. : 4,964,700

DATED : October 23, 1990

INVENTOR(S) : HIROSHI TAKABAYASHI   Page 1 of 3

It is certified that error appears in the above-identified patent and that said Letters Patent is hereby corrected as shown below:

ON THE TITLE PAGE, AT [56] REFERENCES CITED

U.S. Patent Documents,
        "4,640,581  2/1937  Nakanowatari et al." should read
        --4,640,581  2/1987  Nakanowatari et al.--.

COLUMN 1

Line 20, "ferroelectirc" should read --ferroelectric--.
    Line 31, "(ca. 5 C/hr.)" should read --(ca. 5° C/hr.)--.

COLUMN 2

Line 31, "alloY" should read --alloy--.
    Line 47, "above mentioned" should read --above-mentioned--.
    Line 63, "rent," should read --rent--.

COLUMN 3

Line 15, "FIG. 3(C)" should read --FIG. 3(c)--.

UNITED STATES PATENT AND TRADEMARK OFFICE
CERTIFICATE OF CORRECTION

PATENT NO. : 4,964,700

DATED : October 23, 1990

INVENTOR(S) : HIROSHI TAKABAYASHI

It is certified that error appears in the above-identified patent and that said Letters Patent is hereby corrected as shown below:

COLUMN 4

Line 4, "preferablY" should read --preferably--.
    Line 10, "Submicron" should read --Submicro- --.
    Line 11, "Electroopitc" should read --Electrooptic--.
    Line 26, "maY," should read --may,--.
    Line 29, "crYstal" should read --crystal--.
    Line 33, "emploYed" should read --employed--.
    Line 35, "schematically 41a" should read --schematically. 41a--.
    Line 38, "crYstal" should read --crystal--.
    Line 40, "surfaces The" shoudl read --surfaces. The--.

COLUMN 5

Line 3, "velocitY" should read --velocity--.
    Line 16, "velocitY" should read --velocity--.
    Line 17, "effectivelY," should read --effectively,--.
    Line 23, "crYstal" shoudl read --crystal--.
    Line 66, "thermosetting film" should read --thermoset film--.

COLUMN 6

Line 17, "thermostat film" should read --thermoset film--.

COLUMN 7

Line 1, "claim 12" should read --claim 12,--.
    Line 26, "tic a" should read --tic A--.

UNITED STATES PATENT AND TRADEMARK OFFICE
CERTIFICATE OF CORRECTION

PATENT NO. : 4,964,700
DATED : October 23, 1990
INVENTOR(S) : HIROSHI TAKABAYASHI It is certified that error appears in the above-identified patent and that said Letters Patent is hereby corrected as shown below:

COLUMN 8

Line 46, "claim 23," should read --claim 33,--.

Signed and Sealed this

Twenty-seventh Day of April, 1993

Attest:

MICHAEL K. KIRK

*Attesting Officer*     Acting Commissioner of Patents and Trademarks